(12) United States Patent  
Ummethala et al.

(10) Patent No.: US 9,298,106 B1  
(45) Date of Patent: Mar. 29, 2016

(54) WAFER STAGE WITH RECIPROCATING WAFER STAGE ACTUATION CONTROL

(75) Inventors: Upendra Ummethala, Cupertino, CA (US); Marek Zywno, San Jose, CA (US); Layton Hale, Castro Valley, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 426 days.

(21) Appl. No.: 13/606,951

(22) Filed: Sep. 7, 2012

Related U.S. Application Data

(60) Provisional application No. 61/531,725, filed on Sep. 7, 2011.

(51) Int. Cl.
*G03F 7/20* (2006.01)
*H01L 21/68* (2006.01)

(52) U.S. Cl.
CPC ........ *G03F 7/70758* (2013.01); *G03F 7/70725* (2013.01); *G03F 7/70775* (2013.01); *H01L 21/68* (2013.01)

(58) Field of Classification Search
CPC ............ G03F 7/70691; G03F 7/70716; G03F 7/70725; G03F 7/70758; G03F 7/70766; G03F 7/70775
USPC .......................................................... 355/72
See application file for complete search history.

(56) References Cited

U.S. PATENT DOCUMENTS

| | | | |
|---|---|---|---|
| 5,506,684 A * | 4/1996 | Ota et al. ...................... 356/401 |
| 6,157,159 A * | 12/2000 | Korenaga et al. ............. 318/649 |
| 6,177,978 B1 * | 1/2001 | Korenaga ........................ 355/53 |
| 2004/0075201 A1 * | 4/2004 | Yoda et al. ..................... 267/136 |
| 2007/0194632 A1 * | 8/2007 | Yura et al. ....................... 310/12 |
| 2007/0222303 A1 * | 9/2007 | Nishimura ...................... 310/12 |
| 2008/0001482 A1 * | 1/2008 | Ohishi ............................. 310/12 |
| 2008/0100149 A1 * | 5/2008 | Shibata ........................... 310/12 |
| 2008/0158539 A1 * | 7/2008 | Shibata ........................... 355/72 |
| 2008/0170213 A1 * | 7/2008 | Ohishi ............................. 355/53 |

* cited by examiner

Primary Examiner — Steven H Whitesell Gordon
(74) Attorney, Agent, or Firm — Suiter Swantz pc llo

(57) ABSTRACT

A wafer stage system with reciprocating wafer stage actuation control may include a wafer stage, a motor configured to actuate the wafer stage in a first and/or second direction along an axis, a first reciprocating mechanism configured to decelerate the wafer stage after the wafer stage is actuated to a desired position in the first direction, the first reciprocating mechanism configured to store energy captured while decelerating the wafer stage in the first direction, the first reciprocating mechanism configured to accelerate the wafer stage in the second direction, and a second reciprocating mechanism configured to decelerate the wafer stage after the wafer stage is actuated to a desired position in the second direction, the second reciprocating mechanism configured to store energy captured while decelerating the wafer stage in the second direction, the second reciprocating mechanism further configured to accelerate the wafer stage in the first direction.

26 Claims, 14 Drawing Sheets

WAFER STAGE WITH RECIPROCATING WAFER STAGE ACTUATION CONTROL

GOVERNMENT LICENSE RIGHTS

The U.S. Government has a paid-up license in this invention and the right in limited circumstances to require the patent owner to license others on reasonable terms as provided for by the terms of Contract No. HR0011-07-9-0007 awarded by the Defense Advanced Research Projects Agency.

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of U.S. Provisional Patent Application entitled SCANNING STAGE MECHANISM WITH EXTERNAL ACTUATOR FOR DECELERATION AND ACCELERATION AT THE END OF TRAVEL, naming Marek Zywno, Upendra Ummethala, and Layton Hale as inventors, filed Sep. 7, 2011, Application Ser. No. 61/531,725.

TECHNICAL FIELD

The present invention generally relates to the actuation of semiconductor wafer stages, and more particularly to reciprocating control of the actuation of semiconductor wafer stages.

BACKGROUND

As the demand for improved semiconductor devices increases the need for improved semiconductor wafer lithography stage control will also continue to increase. Conventional approaches to controlling wafer stage actuation include the use of end bumpers for crash protection in event of stage runaway. Actuation of a given wafer stage (e.g., XY wafer stage, or stacked X-stage and Y-stage) is typically carried out using a servo system having stage motors suitable for "turning around" the given stage on its scanning path underneath a given radiation source (e.g., e-beam column). Typically, turnaround systems are configured to turn around the actuating stage before making contact with the bumper at either end of the scanning path. In conventional systems, under normal operational settings (i.e., no run away malfunctions), the bumpers located at each end of the scanning path have no active role. In conventional settings, it is only during run away malfunction that the bumpers of a wafer stage system take on an active role.

As wafer stage accelerations continue to increase, and turnaround frequency increases, generated wafer motor heat has little time to dissipate through the stage and to the external surroundings, an effect compounded in vacuum stage applications. The inability to dissipate heat is particularly problematic in metrology settings due to the associated thermal drift. The generated heat typically can only be dissipated through conduction into the wafer stage and radiation from the coil to the stator, and then on to the outer stage. These transfer mechanisms are inadequate for high speed and high duty cycle stages. Further, in order to avoid burning the motors of the wafer stage, air or liquid cooling must be provided. These associate cooling hoses cause additional disturbance to fast moving stages. Therefore, it is desirable to provide a wafer stage actuation control system, which cures the deficiencies of the prior at.

SUMMARY

A wafer stage system with reciprocating wafer stage actuation control is disclosed. In a first aspect, wafer stage system with reciprocating wafer stage actuation control may include, but is not limited to, a wafer stage configured for receiving a wafer; one or more motors configured to actuate the wafer stage in at least a first direction and a second direction along at least one axis; a first reciprocating mechanism configured to decelerate the wafer stage after the wafer stage is actuated to a desired position in the first direction, the first reciprocating mechanism further configured to store energy captured while decelerating the wafer stage in the first direction, the first reciprocating mechanism further configured to accelerate the wafer stage in the second direction utilizing the energy stored in the first reciprocating mechanism; and a second reciprocating mechanism configured to decelerate the wafer stage after the wafer stage is actuated to a desired position in the second direction, the second reciprocating mechanism further configured to store energy captured while decelerating the wafer stage in the second direction, the second reciprocating mechanism further configured to accelerate the wafer stage in the first direction utilizing the energy stored in the second reciprocating mechanism.

In another aspect, the wafer stage system with reciprocating wafer stage actuation control may include, but is not limited to, a wafer stage configured for receiving a wafer; one or more motors configured to actuate the wafer stage in at least a first direction and a second direction along at least one axis; a first reciprocating mechanism configured to decelerate the wafer stage after the wafer stage is actuated to a desired position in the first direction, the first reciprocating mechanism further configured to store energy captured while decelerating the wafer stage in the first direction, the first reciprocating mechanism further configured to accelerate the wafer stage in the second direction utilizing the energy stored in the first reciprocating mechanism; and a second reciprocating mechanism configured to decelerate the wafer stage after the wafer stage is actuated to a desired position in the second direction, the second reciprocating mechanism further configured to store energy captured while decelerating the wafer stage in the second direction, the second reciprocating mechanism further configured to accelerate the wafer stage in the first direction utilizing the energy stored in the second reciprocating mechanism; and a computing system communicatively coupled to the one or more motors and one or more motion detectors, the computing system being configured to: measure a velocity loss caused by an interaction between the wafer stage and the first or second reciprocating mechanism; determine an amount of force required to compensate for the measured velocity loss; and calibrate the one or more motors utilizing the determined amount of force required to compensate for the measured velocity loss.

A method for providing reciprocating actuation control of a scanning wafer stage is disclosed. In a first aspect, the method may include, but is not limited to, actuating a wafer stage in at least a first direction and a second direction along at least one axis utilizing one or more motors, the wafer stage being configured for receiving a wafer; decelerating the wafer stage after the wafer stage is actuated to a desired position in the first direction utilizing a first reciprocating mechanism; storing energy captured while decelerating the wafer stage in the first direction utilizing the first reciprocating mechanism; accelerating the wafer stage in the second direction utilizing energy stored by the first reciprocating mechanism; decelerating the wafer stage after the wafer stage is actuated to a desired position in the second direction utilizing a second reciprocating mechanism; storing energy captured while decelerating the wafer stage in the second direction utilizing the second reciprocating mechanism; and accelerating the wafer stage in the first direction utilizing energy stored in the second reciprocating mechanism.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1A:
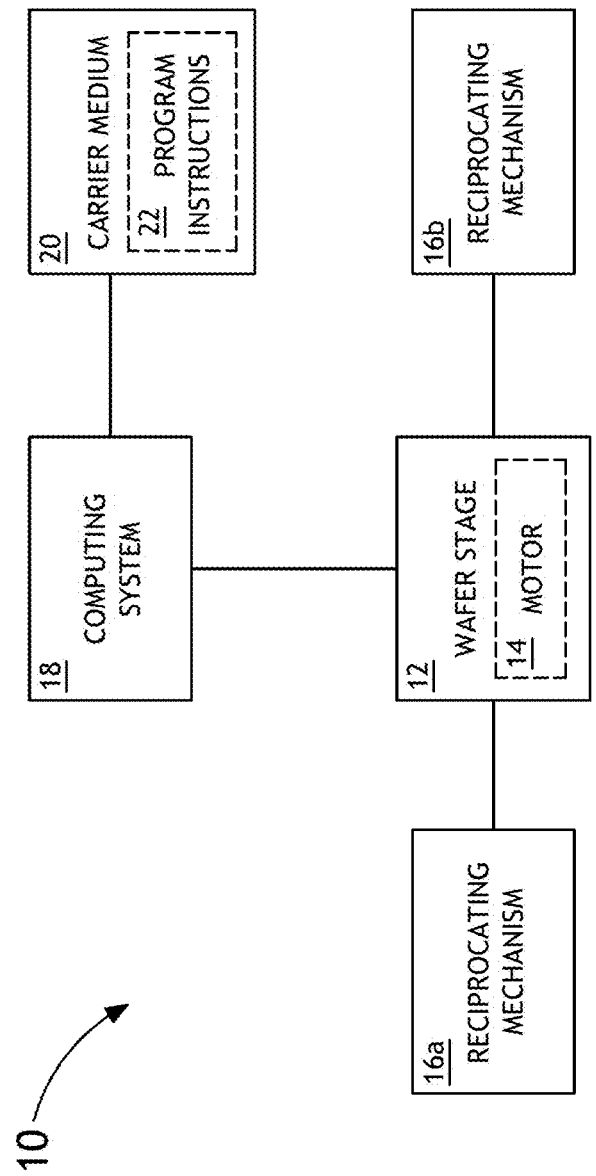
FIG. 1A is a block diagram view of a wafer stage system with reciprocating wafer stage actuation control, in accordance with one embodiment of the present invention.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Referring generally to FIG. 1A through 6C, a reciprocating wafer stage actuation control system is described in accordance with the present disclosure. The present invention is directed to wafer stage system equipped with advance reciprocating actuation control. The reciprocating wafer stage actuation control system of the present invention may be utilized in the context of semiconductor wafer scanning stages (e.g., XY stages), in which the scanning X-axis is substantially faster than the indexing Y-axis. The present invention reduces heat generated in the linear motors of a given scanning stage during the deceleration/acceleration turnaround process, which occurs at the end of one scan and the beginning of the next scan. The wafer stage control system of the present invention includes a reciprocating mechanism that augments the mechanical force of the linear stage and reduces the demand on the linear stage during the turn around process. The reciprocating mechanism of the present invention allows the linear stage to maintain a prescribed scanning trajectory and reduces the demand on the linear stage during the turnaround process. Further, the reciprocating mechanisms of the present invention may be built into an external frame of the scanning system and reduce the amount of heat transfer to the scanning stage.

In a stacked wafer stage, one feature may include a return spring bumper attached at the ends of travel of the stage, which optimally contacts the stage at the axis running through the center of mass of the scanning stage. If the turnaround point is variable, as in the case of scanning a round wafer, the bumpers may include a mechanism allowing for the translation of the point of contact with the stage to the desired location. This mechanism may move together with the lower stage (e.g., Y-stage) and face the center of gravity of the scanning stage. In this case, inertial reaction forces are transferred to the stage base through the bearings of the lower stage. In a maglev stage, one solution may include a separate XY bumper stage, wherein the bumper is positioned on the axis of the center of gravity of the moving stage. Generally, a maglev stage includes highly sensitive position sensors. For example, a maglev stage may be equipped with laser interferometers, linear encoders, and the like. These position sensors may detect parasitic angular motions caused by the stage impacting the bumpers off-axis. The system may, therefore, undergo a calibration procedure to accurately bring the point of impact on the axis of center of gravity. In addition to calibration, an adaptive control system could be used to drive the bumper mechanism in order to minimize payload dynamic moments caused by off-axis impacts.

FIG. 1A illustrates a block diagram view of a wafer stage system 10 having reciprocating wafer stage actuation control, in accordance with the present invention. The wafer stage system 10 may include a wafer stage 12 (e.g., X-Y wafer stage) and one or more motors 14 configured to translate one or more wafers along at least one of a first direction (e.g., X-direction) and a second direction (e.g., Y-direction) under a radiation source. In a further aspect, the wafer stage system 10 includes a first reciprocating mechanism 16a and a second reciprocating mechanism 16b. The first reciprocating mechanism 16a is configured to decelerate the wafer stage 10 after the wafer stage 10 is actuated to a desired position in the first direction (e.g., −X direction). In addition, the first reciprocating mechanism 16a is further configured to store energy captured during deceleration of the wafer stage 10 in the first direction. In turn, the first reciprocating mechanism 16a is further configured to accelerate the wafer stage 12 in the second direction (e.g., +X direction) utilizing the energy stored in the first reciprocating mechanism 16a. Likewise, the second reciprocating mechanism 16b is configured to decelerate the wafer stage 10 after the wafer stage 12 is actuated to a desired position in the second direction (e.g., +X direction). In addition, the second reciprocating mechanism 16b is further configured to store energy captured during deceleration of the wafer stage 12 in the second direction. In turn, the second reciprocating mechanism 16b is further configured to accelerate the wafer stage 12 back in the first direction (e.g., −X direction) utilizing the energy stored in the second reciprocating mechanism 16b.

As one example, each reciprocating mechanism 16a, 16b may include an external actuator mechanism (e.g., actuatable base) and/or a spring mechanism (e.g., spring mechanism mechanically coupled to wafer stage spring mechanism mechanically coupled to actuatable base). The remainder of the present disclosure will describe various embodiments of the wafer stage system 10, including the various architectures for providing the reciprocating mechanisms 16a, 16b of the present invention.

In a further aspect, the wafer stage system 10 may include one or more computing control systems 18 equipped with one or more processors (not shown). The computing control systems 18 may be configured to execute a set of program instructions 22 stored on a carrier medium 20 (e.g., non-transitory storage medium). The program 22 instructions may be configured to carry out one or more of the various steps described throughout the present disclosure. In one aspect, the computing system 18 may execute the program instructions 22 in order to perform the steps: (i) measuring a velocity loss caused by an interaction between the wafer stage and the first or second reciprocating mechanism; (ii) determining an amount of force required to compensate for the measured velocity loss; and (iii) calibrating the one or more motors utilizing the determined amount of force required to compensate for the measured velocity loss.

Figure 1B:
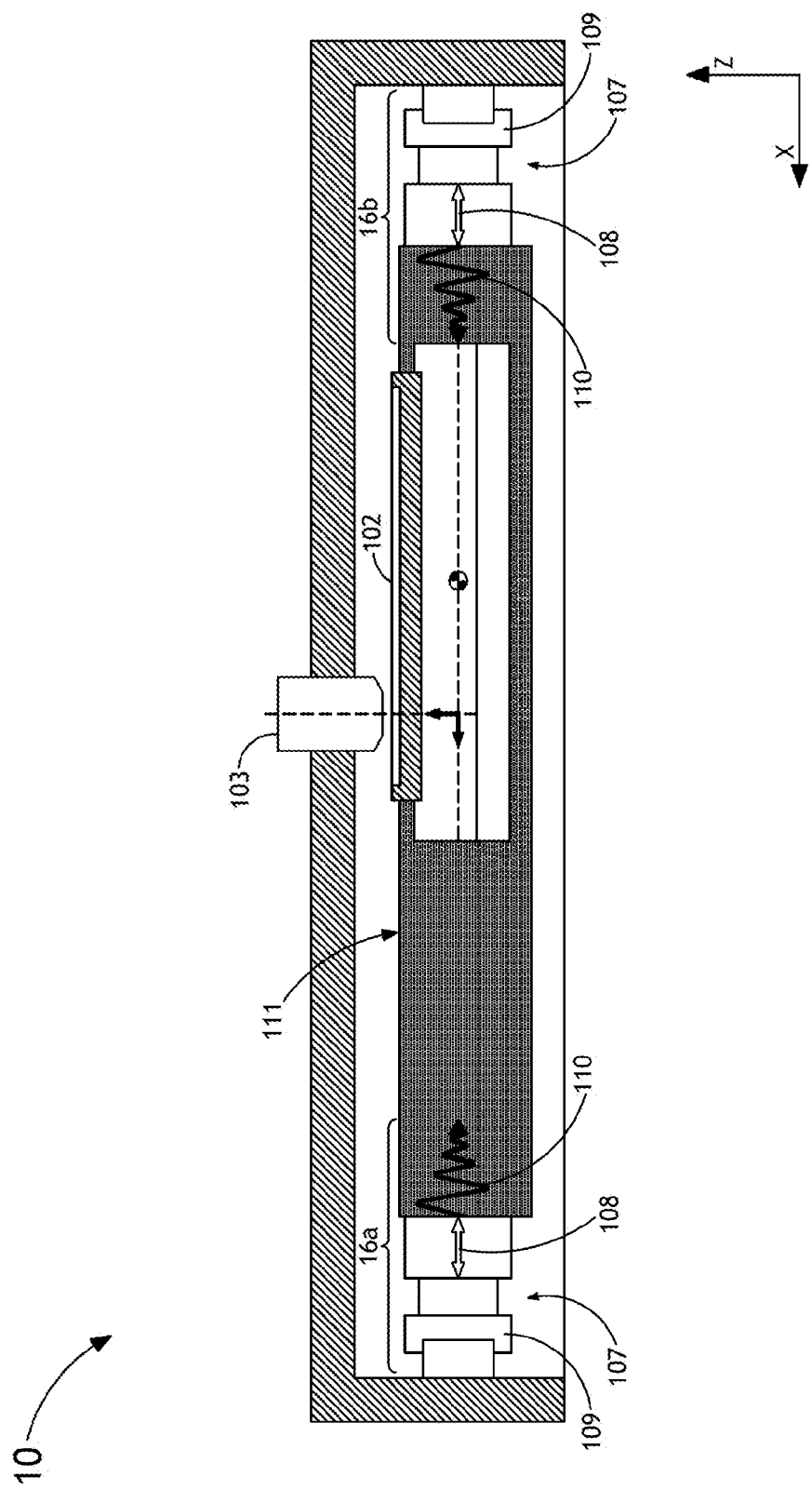
FIG. 1B is a schematic view of a wafer stage system with reciprocating wafer stage actuation control, in accordance with one embodiment of the present invention.
Figure 1C:
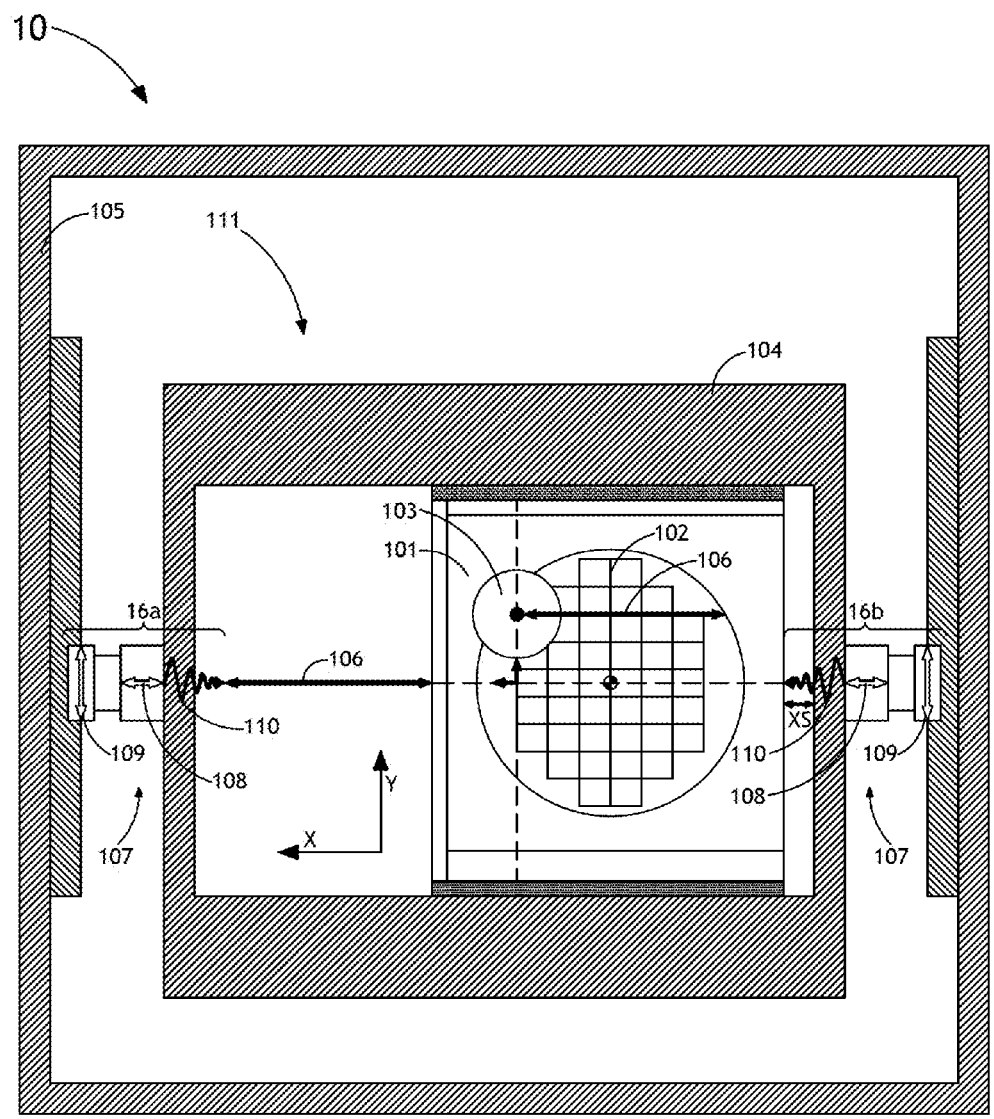
FIG. 1C is a schematic view of a wafer stage system with reciprocating wafer stage actuation control, in accordance with one embodiment of the present invention.

FIGS. 1B and 1C illustrate schematic views of the wafer stage system 10 equipped with reciprocating wafer stage actuation control, in accordance with one embodiment of the present invention. In one aspect, the wafer stage system 10 may include an XY stage system 111. In one embodiment, the wafer stage system 10 may include a planar XY stage, whereby an XY motor drives the wafer stage in either X- or Y-direction. In another embodiment, the wafer stage system 10 may include a stacked XY stage. For example, the stacked XY stage may include an X-stage 101 suitable for translating a wafer 102 along the X-axis. In addition, the wafer stage system 10 may include a Y-stage 104 configured to translate X-stage 101 along the Y-axis, which is substantially perpendicular to the X-axis. In this regard, the Y-stage 104 may translate the X-stage 101 along the Y-axis, while the X-stage translates the wafer 102 along the X-axis, as measured relative to a stationary frame of reference, such as the vacuum chamber 105. Applicant notes herein that for the purposes of the present disclosure the X-axis and Y-axis are used to generically indicate a first axis, and a second axis, which are arranged orthogonal to one another.

In a general sense, the XY wafer stage 111 of the wafer stage system 10 is configured to scan one or more wafers 102 under a source of radiation 103, such as an electron beam column or another radiation source (e.g., illumination beam of optical inspection system). In one embodiment, the X-stage 101 is configured to scan the wafer 102 at high velocity (e.g., 1 m/s) along the X-axis. Then, the Y-stage may step the X-stage from swatch to swath by translating the X-stage along the Y-axis. In this regard, the wafer 102 may be scanned in a "serpentine" manner under the given radiation source 103.

In one embodiment of the present invention, the first and second reciprocating mechanisms 16a, 16b of wafer stage system 10 may include an actuatable base 107, commonly referred to herein as an "external actuator mechanism," and a spring mechanism 110 (e.g., a spring). For example, the actuatable bases 107 of the reciprocating mechanisms 16a, 16b may be disposed at opposite ends of the scanning path 106 along the X-axis. It is noted herein that the actuatable bases 107 may act to reduce power dissipation in the motors of the X-stage 101 in the X-direction.

In a further embodiment, each actuatable base 107 may be mechanically coupled to a spring mechanism 110. In this regard, each actuatable base may be configured to actuate the springs 110 to desired positions for engaging the wafer stage 101. At the end of each scanning stroke 106, the X-stage 101, which may be driven by X-stage servomotors, may be driven into a spring mechanism 110. Upon sensing contact between the X-stage and the spring mechanism 110, a controller (not shown) (see X-stage controller 152 of FIG. 1D) may signal the X-stage to decelerate with a profile matching the calibrated deceleration caused by the spring mechanism 110 (e.g., spring, spring bumper, and the like). Then, the X-stage servo system may maintain the X-stage 101 on the deceleration/acceleration trajectory, which allows the mass of the X-stage 101 to follow the natural spring action. The kinetic energy of the X-stage 101 then converted to potential energy through the deformation of the spring mechanism 110 by $x_s$. At the end of the scanning path 106, the X-stage 101 stops, and then the spring mechanism 110 returns the stored potential energy back to the X-stage 101 in the form of kinetic energy, thereby accelerating the X-stage 101 in the opposite direction and away from the spring mechanism 110, at approximately the original scanning velocity. It is noted herein that due to the relatively high efficiency of energy conversion in a spring system, the deceleration/acceleration process described above dissipates very little energy.

In an additional embodiment, the reciprocating mechanisms 16a, 16b of the wafer stage system 10 may each include an extension mechanism 108. It is noted herein that as the X-stage scans 101 a round wafer, the length of the stage stroke 106 for each chord of the wafer is different. As such, the distance the X-stage 101 travels between the spring mechanisms 110 changes as well. In order to accommodate for this phenomena the spring mechanism 110 of each reciprocating mechanism 16a, 16b may be driven with an extension mechanism 108. For example, each extension mechanism many include, but is not limited to, a lead screw mechanism. In this regard, the extension mechanism may be used to adjust the position of the spring mechanisms 110 so to meet the X-stage 101 at a position suitable for the beginning of the deceleration and return acceleration process.

In a further embodiment, the mechanism 108 may be attached to the carriage of the Y-stage 104. In settings where the Y-stage 104 includes mechanical bearings (i.e., roller bearings) impacting the Y-stage 104 motion along the Y-axis, the bearings of the Y-stage 104 may transfer the reaction force from the stage turnaround to the outer frame 105 of the wafer stage system 10. In some cases, such as in magnetic levitation (maglev) stages, it is advantageous to transfer the reaction force of the X-stage 101 turnaround directly to the frame 105, utilizing a separate Y-direction actuation mechanism 109, and not through the bearings of the Y-stage 104. In this regard, when the X-stage 101 and the Y-stage 104 move along the Y-axis, the spring mechanisms 110 (attached to the Y-direction actuation mechanism 109) track the stages 101 and 104. In this regard, the spring mechanism 110 is always aligned with the X-stage 101.

Figure 1D:
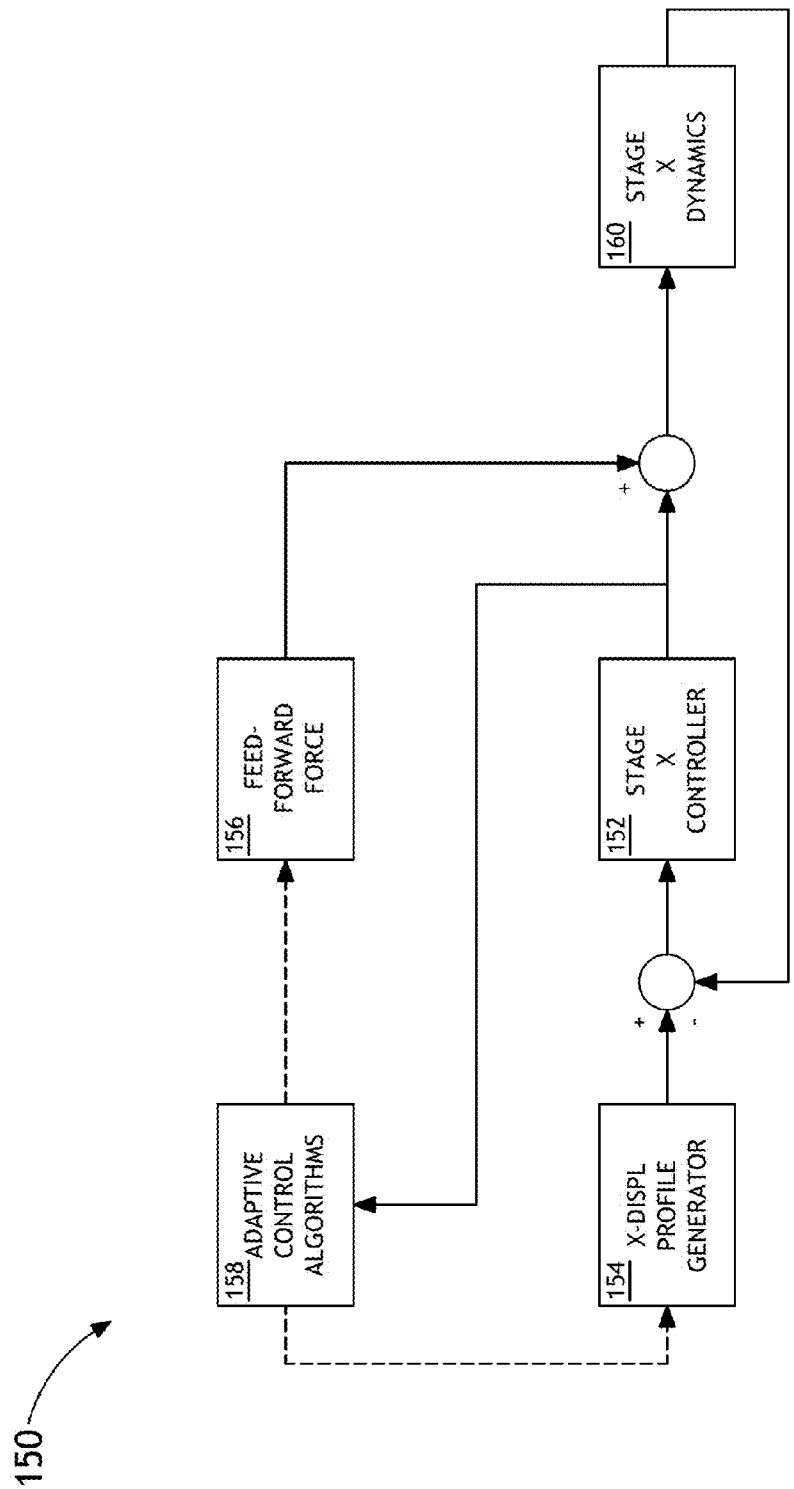
FIG. 1D is a block diagram view of a control process used to control the wafer stage of the wafer stage system, in accordance with one embodiment of the present invention.

FIG. 1D illustrates a block diagram view of the X-axis control process system 150 suitable for optimizing or at least improving the wafer stage actual control of the present invention. In one aspect, the data processing portions of the process control system 150 of FIG. 1D are executable utilizing one or more computer control systems 18 of the system 10. In this regard, the computer control system 18 may execute a set of program instructions 22 configured to cause the system 10, such as a processor of the computing system 18, to execute one or more of the various steps described below. As previously noted, the program instructions 22 implementing methods such as those described herein may be transmitted over or stored on a carrier medium. The carrier medium may be a transmission medium such as a wire, cable, or wireless transmission link. The carrier medium may also include a memory medium such as a read-only memory, a random access memory, a magnetic or optical disk, or a magnetic tape.

In general, the term "processor" may be broadly defined to encompass any device having one or more processors, which execute instructions from a carrier medium (e.g., memory medium). In this sense, the one or more processors of the computing system 118 may include any microprocessor-type device configured to execute software algorithms and/or instructions. In one embodiment, the one or more processors may consist of a desktop computer or other computer system (e.g., networked computer) configured to execute a program configured to operate the system 10, as described throughout the present disclosure. It should be recognized that the steps described throughout the present disclosure may be carried out by a single computer system or, alternatively, multiple computer systems. Moreover, different subsystems of the system 10 may include a processor or logic elements suitable for carrying out at least a portion of the steps described throughout the present disclosure.

The computing system 18 may execute the program instructions 22 in order to perform the steps of (i) measuring a velocity loss caused by an interaction between the wafer stage 101 and the first or second reciprocating mechanism; (ii) determining an amount of force required to compensate for the measured velocity loss; and (iii) calibrating the one or more motors utilizing the determined amount of force required to compensate for the measured velocity loss.

In a first aspect, the offset between the bumpers (i.e., spring mechanism 110 and actuatable bases 107 of reciprocating mechanisms 16a, 16b) and the center of gravity of the X-stage 101 may be corrected for by performing the following calibration procedure. First, accelerate the stage 101 up to a speed in the X-direction and prior to impact with the spring mechanism 110 of the reciprocating mechanism 16a or 16b the X-axis servo control may be turned off, thereby allowing the stage 101 to impact the spring mechanism 110. Then, by measuring the transient rotations about the Y- and Z-axes, the offset may be estimated. Then, the bumpers (spring mechanism 110 mounted on actuatable base 107) may be moved in the Y-direction, while the Z-height of the magnetic levitation stages (i.e., X-stage 101) is adjusted based on the offset estimate. The above procedure may be repeated until an acceptably small rotation is observed about the Y- and Z-axes. The difference between the Y and Z stage position and the Y and Z position of the bumper may be recorded. Then, the bumper may be servoed to follow the stage. Since the stage is not intended to change position in the Z-direction dynamically, the z-position of the bumper may be adjusted one time during the alignment process.

In a second aspect, once the offset is calibrated for, a profile generator 154 may execute the following procedure in order to design the profile that the control system 150 needs to track. Upon reaching the position at which scanning is completed, the X-stage controller (see controller 152 described below) may be turned off and the X-stage 101 may be allowed to "coast" onto the bumper and return. Then, the magnitude of the velocity loss due to damping and hysteretic losses may be measured. Based on this measurement, the amount of force impulse needed to compensate for the damping and hysteretic losses may be estimated. In turn, a force profile may be designed (using one or more adaptive control algorithms 158) that provides the required force impulse, while also minimizing power and limiting jerk to acceptable limits. The impulse estimate may be iteratively improved until the rebound velocity is within limits that could be corrected using the feedback control system (see 152 of FIG. 1D). Once this calibration procedure is complete, the stage 101 may be accelerated to the scanning velocity and impacted onto the bumper with the feed-forward force profile designed above. Then, the displacement and velocity profile may be measured with the compensating force impulse in place. This profile may be used as the reference command to the control system during actual closed loop operation, whereby the force command, computed as described above, is utilized as a feed-forward force profile 156.

The calibration procedure described above may be repeated for the range of velocities used in the operation of the X-stage 101. In addition, interpolation within the range fitting to the theoretical spring system response may be necessary to construct the profile for each velocity with the range. Note the same process may be carried out for the feed-forward force profile.

In settings where the feed-forward force 156 and the position profile (from X-displacement profile generator 154) are in with acceptable requirements, the X-stage feedback controller 152 does not need to inject any additional force via the adaptive control algorithms 158. In settings where the controller 152 requires an additional force, the required additional force 156 may be used to adaptively dynamical features of the X-stage 160. For example, the controller 152 may compensate for stiffness and damping variations (due to slow phenomena). The adaptive controller may vary the position profile and feed-forward force as required.

Figure 2A:
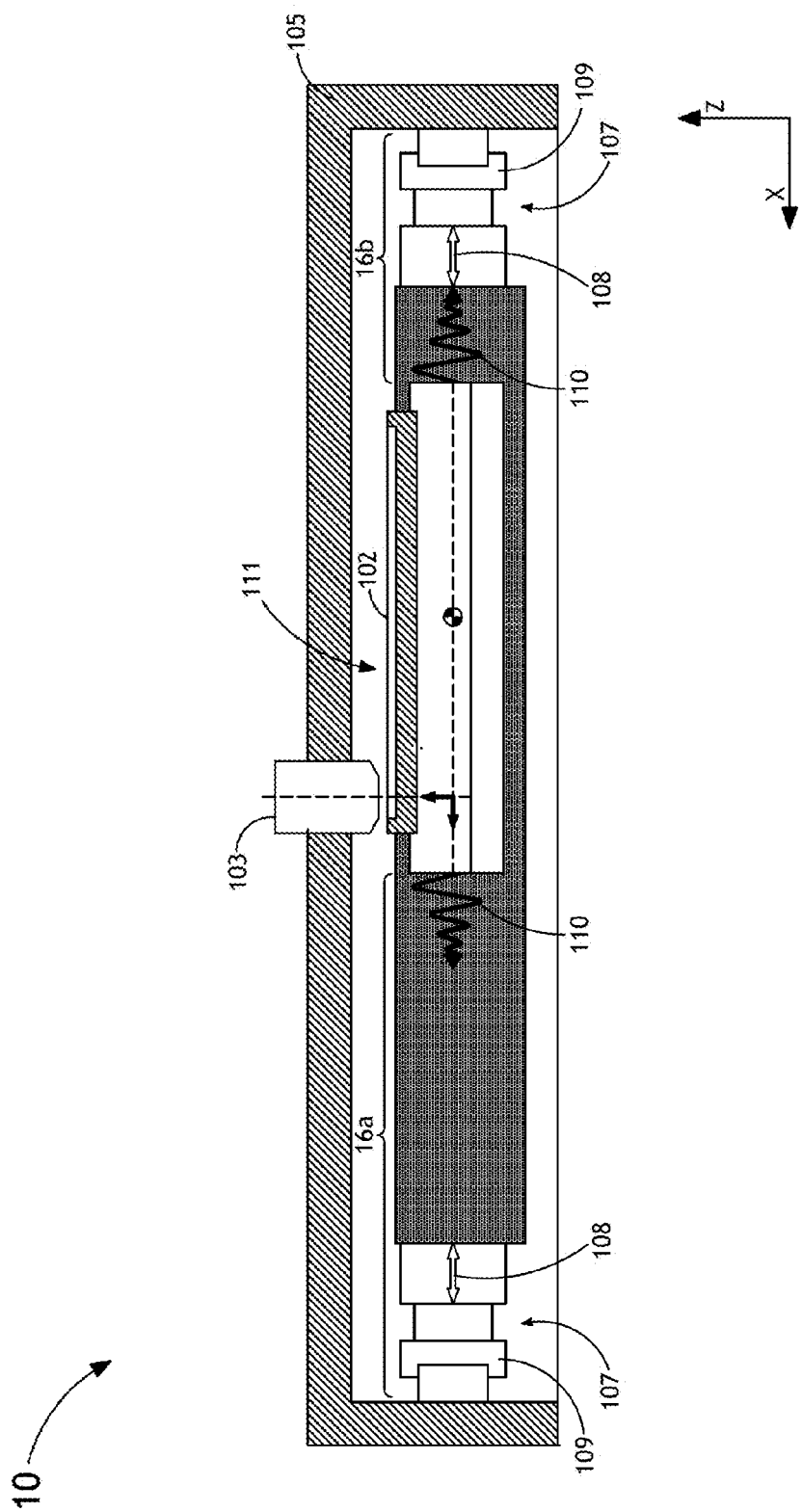
FIG. 2A is a schematic view of a wafer stage system with reciprocating wafer stage actuation control, in accordance with one embodiment of the present invention.
Figure 2B:
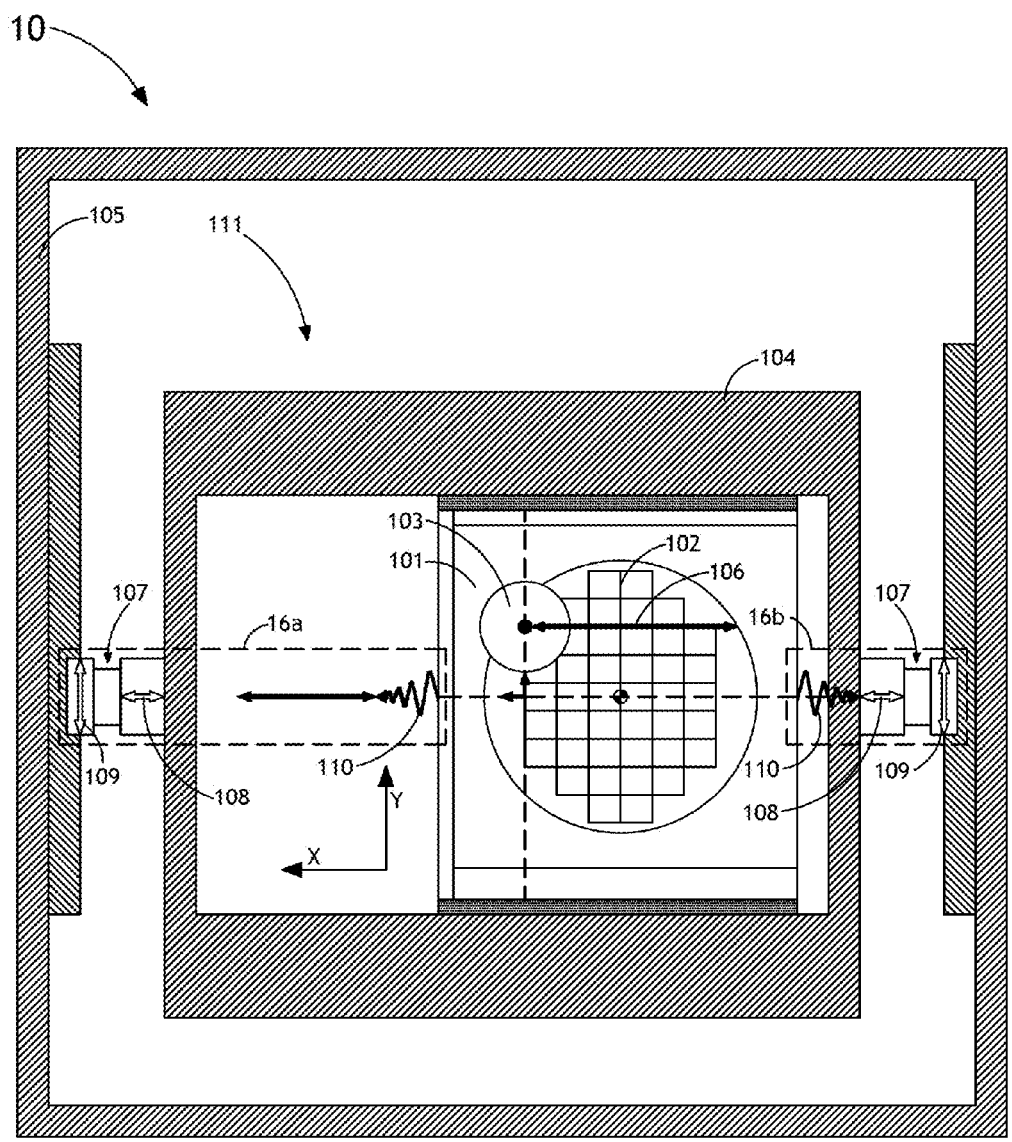
FIG. 2B is a schematic view of a wafer stage system with reciprocating wafer stage actuation control, in accordance with one embodiment of the present invention.

FIG. 2A and FIG. 2B illustrate an alternative embodiment of the present invention, wherein the spring mechanisms 110 of each reciprocating mechanism 16a, 16b may be mounted to the wafer stage 111. In this regard, the spring mechanisms 110 may be mounted at opposite ends of the wafer stage 111 along the X-direction. It is further noted that the actuatable bases 107, which each include an extension mechanism 108 (x-direction) and a y-direction actuation mechanism 109, of the wafer stage system 10 may be mounted directly to a stationary outer frame 105. Applicant notes that the description of FIGS. 1A through 1C provided above should be interpreted to extend to the disclosed embodiment of FIGS. 2A and 2B unless otherwise noted.

Figure 3:
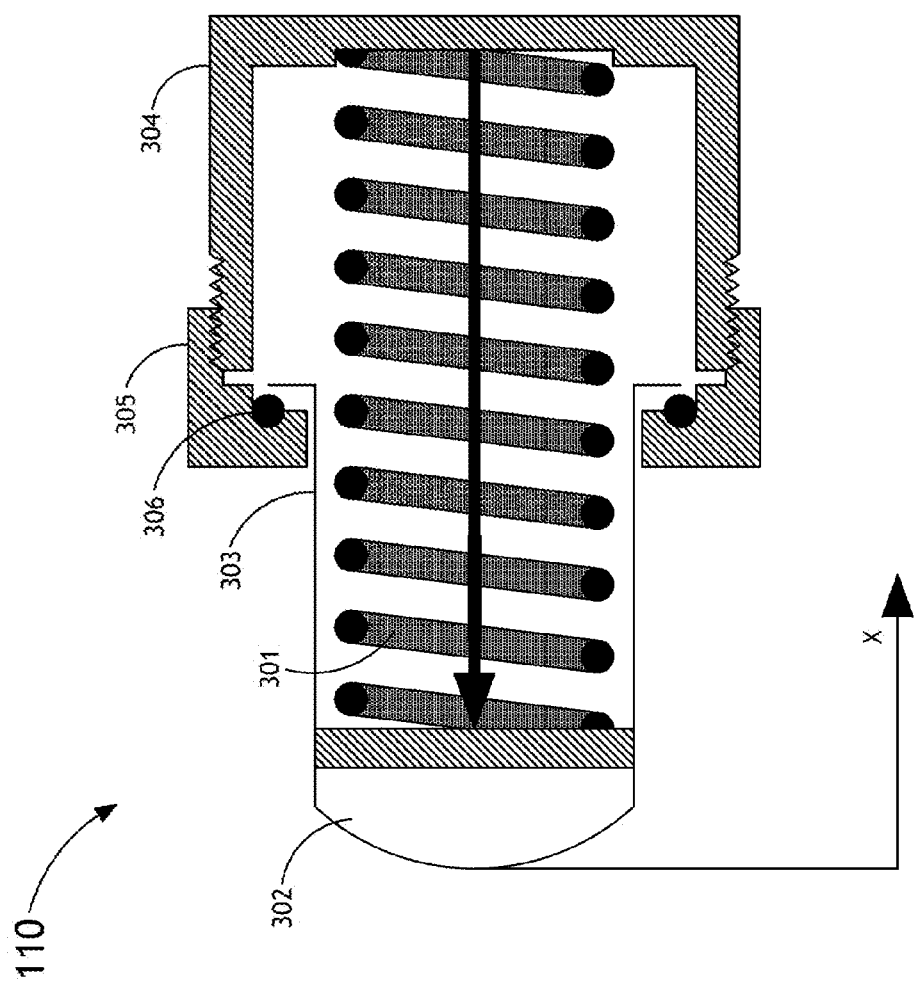
FIG. 3 is a schematic view of a compression spring mechanism and damper for use in the wafer stage system, in accordance with one embodiment of the present invention.

FIG. 3 illustrates a schematic view of a compression-based spring mechanism 110 of the first or second reciprocating mechanisms 16a, 16b, in accordance with an embodiment of the present invention. The spring mechanism 110 of each reciprocating mechanisms 16a, 16b may include a compression spring 301. The compression spring 301 further includes a tip 302 suitable for reducing "jerk" caused by acceleration of the spring plunger. The tip 302 further aids in controlling contact wear and spring dynamics. In a further embodiment, the spring 301 of the spring mechanism 110 may be enclosed in a plunger housing unit 303. The housing unit 303 may act to reduce or at least contain potential contamination caused by the plunger motion. It is noted that at the point of full extension of a given stroke the spring 301 may contact an o-ring damper (which in turn contacts the o-ring 306) in order to stop spring and plunger vibration after the X-stage 101 moves away from the plunger. The spring mechanism 110 may further include a bumper housing 304. The bumper housing 304 may be threaded in order to allow adjustment of the o-ring housing nut 305 to contact the plunger at the end of a stroke in order to properly dampen the spring vibration.

In a further embodiment, the spring 301 may be progressive, where the force (F) in the spring 301 is expressed by $F=F_0+k*p$, wherein F0 represents the initial preload of the spring to achieve damping, k is the spring constant, x is the spring deflection, p is the power exponent (equal to 1, less than 1, or more than 1). In a general sense, the spring force F may include any function of the deflection (x) suitable for a given application. As such, the above expression for spring force F should not be interpreted as limiting, but is merely provided for purposes of illustration.

Figure 4:
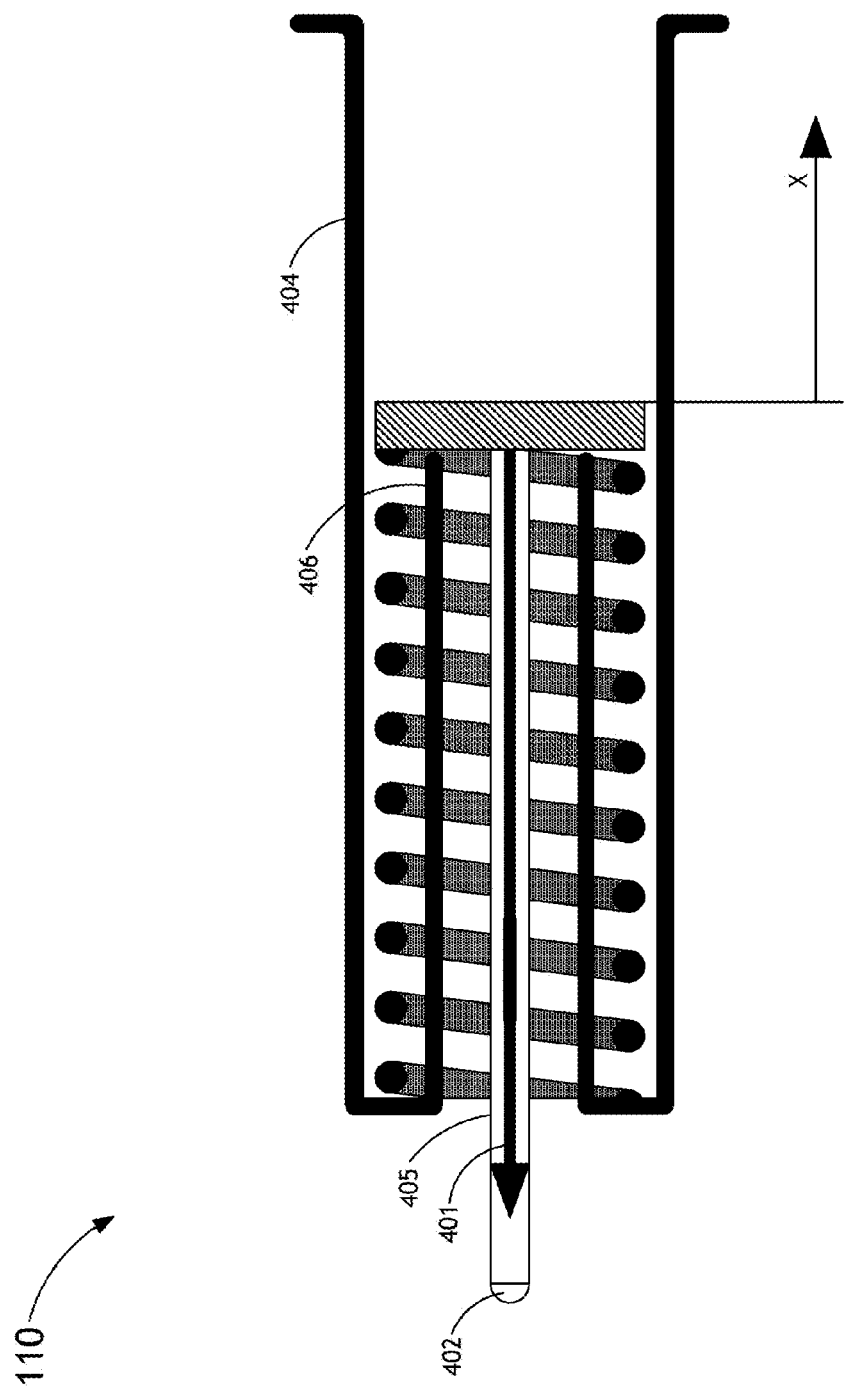
FIG. 4 is a schematic view of an extension spring mechanism and damper for use in the wafer stage system, in accordance with one embodiment of the present invention.

FIG. 4 illustrates a schematic view of an extension-based spring mechanism 110 of the first or second reciprocating mechanisms 16a, 16b, in accordance with an embodiment of the present invention. In this embodiment, the spring mechanism 110 may include an extension spring 401. In this sense, the rod 405 having a jerk and contamination reducing tip 402 may act to decelerate the X-stage 101. The bumper (spring mechanism 110) of FIG. 4 is suitable for mounting on an outer frame 105 of the wafer stage system 10 or on an actuatable base 107 of the wafer stage system 10. In a further embodiment, the spring mechanism 110 may include a damping elastomer 406 configured to absorb vibration of the spring 401 after it returns to the resting position following stage turnaround.

Figure 5A:
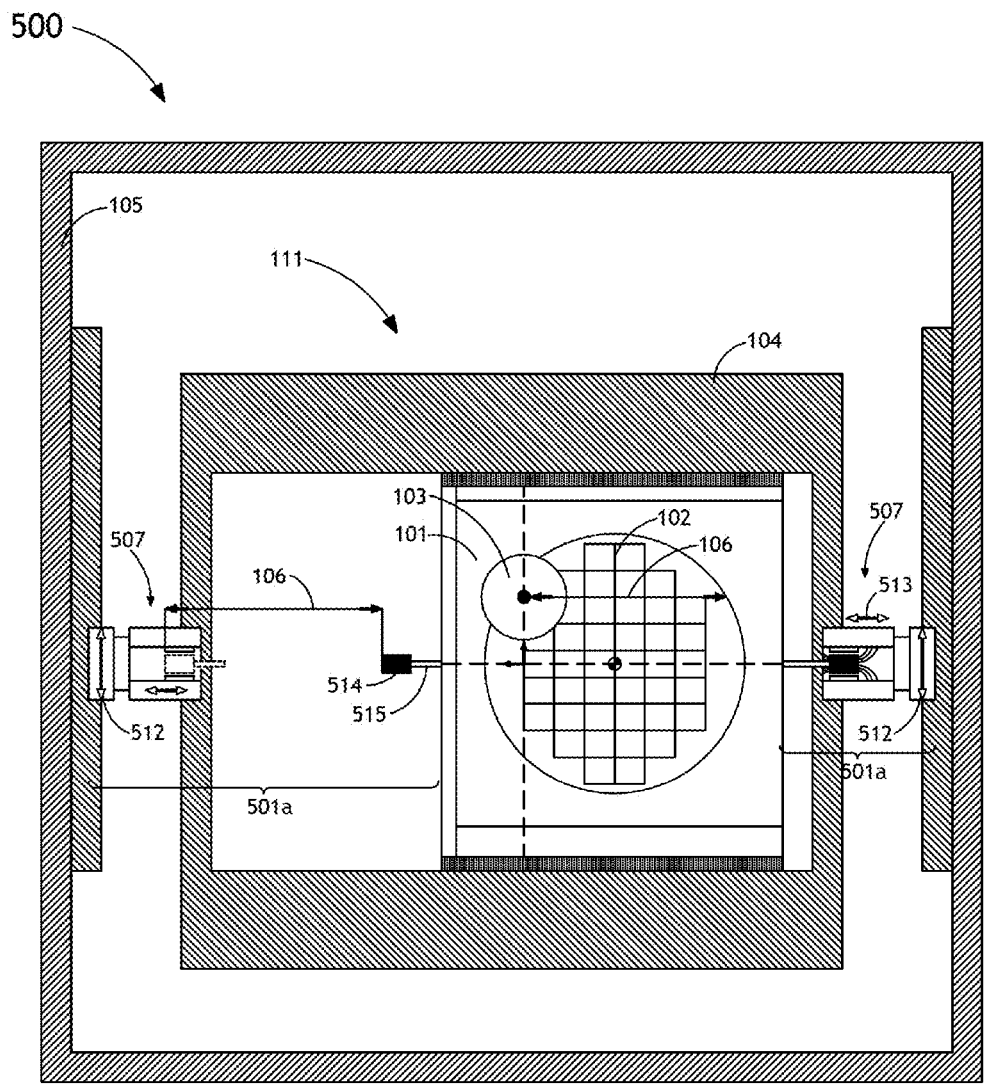
FIG. 5A is a schematic view of an electromagnetic-based wafer stage system with reciprocating wafer stage actuation control, in accordance with an alternative embodiment of the present invention.
Figure 5B:
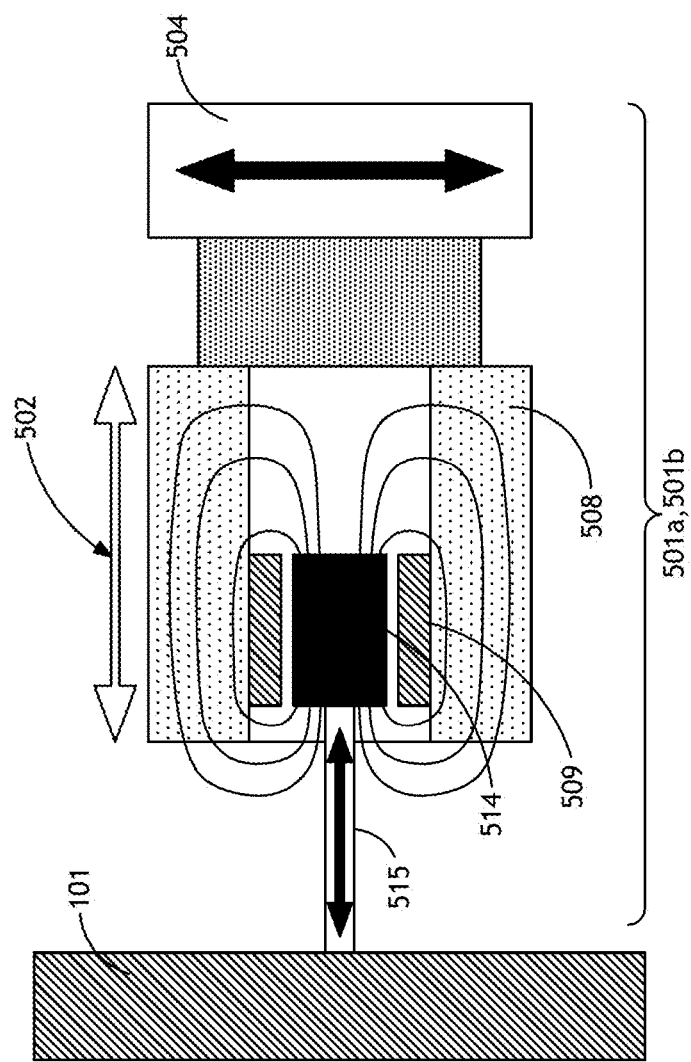
FIG. 5B is a schematic view of an electromagnetic active drive turnaround drive of an electromagnetic-based wafer stage system, in accordance with one embodiment of the present invention.

FIGS. 5A and 5B illustrate schematic views of an electromagnetic-based wafer stage system 500, in accordance with an alternative embodiment of the present invention. In contrast to the spring-based implementations described previously herein, the wafer stage system 500 utilizes non-contact reciprocating mechanisms 501a and 501b. In one embodiment, the non-contact reciprocating mechanism 501a and 501b may include an electromagnet or a voice coil motor. It is noted that a non-contact reciprocating mechanism 501a/501b may be thermally connected to the base of the system and not to the scanning wafer stage assembly 111. As such, the thermal impact on the wafer 102 is minimized and the heat may be readily dissipated.

As shown in FIG. 5B, the non-contact reciprocating mechanisms 501a, 501b may consist of an active turnaround reluctance drive 501a, 501b. The active turnaround reluctance drives 501a, 501b may include actuatable bases 507, consisting of on an X-direction extension mechanism 502 and the Y-direction drive 504, allowing for the alignment with the X-stage 101. In a further embodiment, the X-stage 101 may include two ferromagnetic cores 514 attached to rods 515. As shown in FIG. 5B, as the right-most core 514 passes through the center of the stator coil 509, the coil 509 is actuated with a current producing a magnetic field. The magnetic field begins exerting an axial force on the core 514 in the direction towards the center of the coil. As the core 514 moves deeper into the stator 508, the force decelerates, stops, and then accelerates the stage in the opposite direction. After the stage has reached the scanning velocity, the coil 509 is deactivated and the stage 101 moves away from the right stator, scans through the scanning travel 106, and the left core 514 engages with the left stator 508, decelerates, stops, and then accelerates in the opposite direction. It is further noted that the stator 508 and coil 509 may be mounted on actuatable bases 507, which include X-direction extension mechanism 502 and the Y-direction drive 504, which are discussed in detail previously herein.

This configuration is particularly advantageous as it provides a higher degree of control of the deceleration and acceleration force acting on the X-stage 101. In addition, the configuration of FIGS. 5A and 5B lacks mechanical contacts between the components of the drives 501a, 501b mounted on the X-stage 101 and the components of the drives 501a, 501b mounted on the actuatable bases 507.

In addition, the current in the coils 509 may be controlled by a control system (e.g., computing system 18) in order to produce the optimal deceleration and acceleration velocity, acceleration, jerk and snap profiles of the X-stage 101.

In an alternative embodiment, the active turnaround reluctant drives 501a, 501b may be replaced with Lorentz force drives (not shown). The Lorentz force drives may include permanent magnets mounted on the X-stage 101 (replacing the cores 514), which engage with the stators 508.

In a stacked stage system, it is anticipated that the bumper mechanism may be relatively simplified, with only two bumper extension mechanisms mounted in place of the regular end of travel bumper discussed previously herein.

Figure 6A:
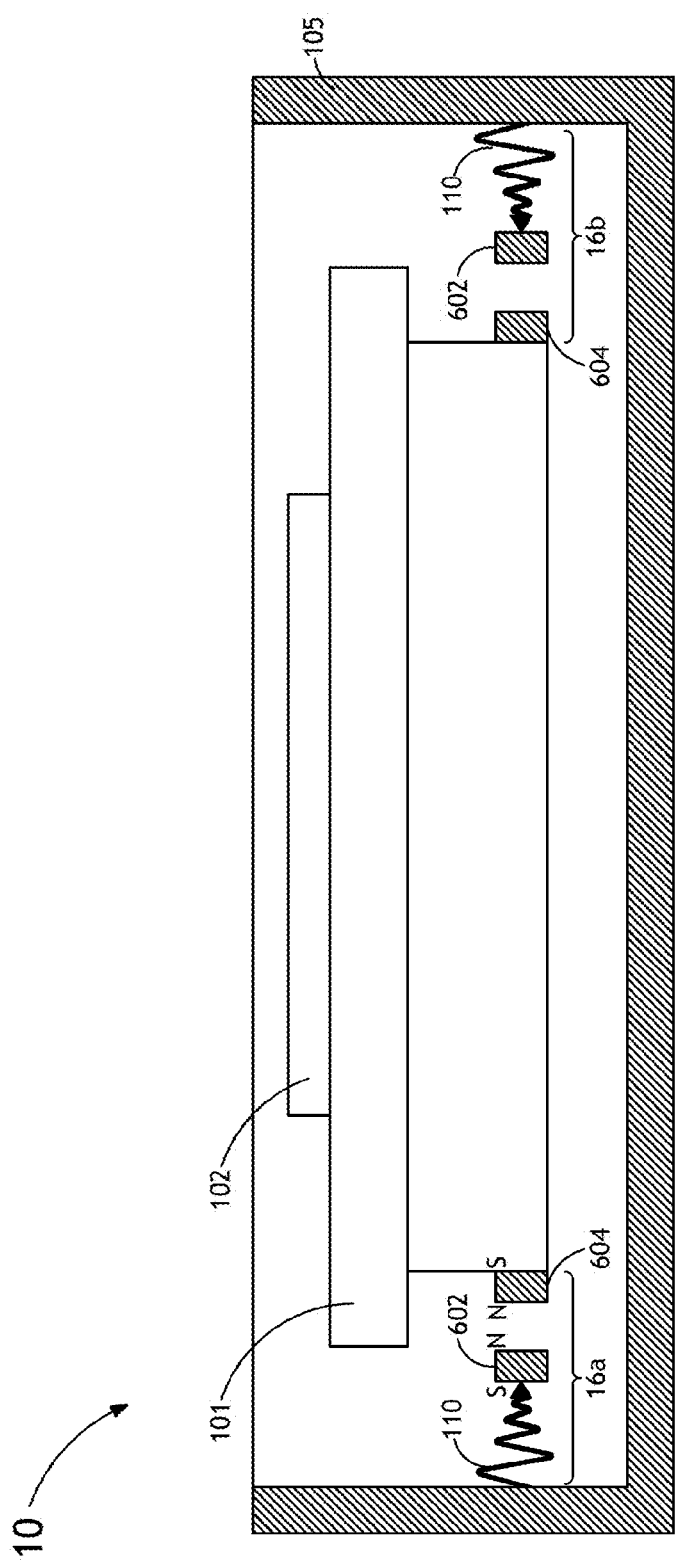
FIG. 6A is a schematic view of a wafer stage system with reciprocating wafer stage actuation control equipped with magnetic control features, in accordance with an alternative embodiment of the present invention.
Figure 6B:
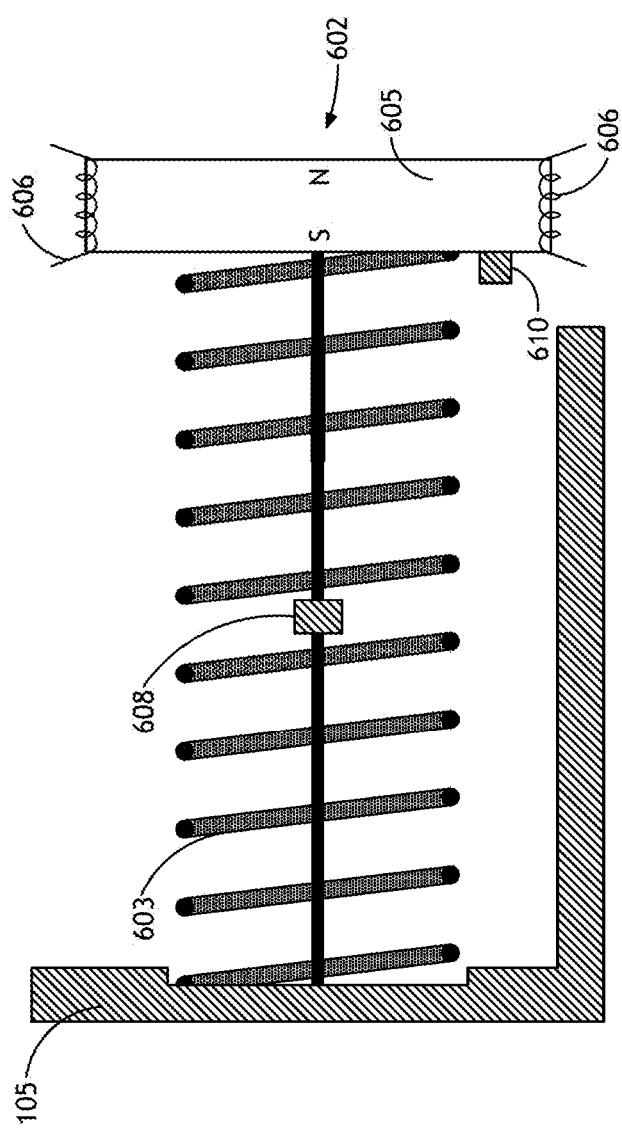
FIG. 6B is a schematic view of a spring mechanism with magnetic control features for use in the wafer stage system, in accordance with an alternative embodiment of the present invention.

FIGS. 6A and 6B illustrate schematic views of an alternative embodiment of wafer stage system 10 of the present invention. In one aspect, each the reciprocating mechanisms 16a, 16b may include a spring mechanism 110 and a pair of magnets 602a and 604a. In one embodiment, the pair of magnets 602a and 602b may be disposed parallel to one another, with like poles facing each other in order to allow for acceleration or deceleration of the wafer stage without mechanical contact. It is noted herein that lack of mechanical contact between the spring mechanism 110 and the X-stage 101 may aid in reducing the production of debris with the wafer stage system 10. For example, a first magnet 602 may be mounted on the spring mechanism 110 of a reciprocating mechanism 16a, 16b, while a second magnet 604 is mounted to the X-stage 101. Due to the like poles of the magnets 602 and 604 facing each other, the magnets 602 and 604 tend to repel one another. The combination of the magnetic repulsion generated by the magnets 602 and 604 and the spring mechanism 110, each reciprocating mechanism 16a, 16b possesses enhanced X-stage 101 motion control. Additionally, it is noted herein that the spring mechanism 110 of FIGS. 6A and 6B may be mounted to an actuatable base (not shown in FIG. 6A), as described previously herein.

As shown in FIG. 6B, magnetically augmented spring mechanism 110 may include a magnet 602 disposed at the end of the spring 603 of the spring mechanism 110. In one aspect, the spring mechanism 110 may be mounted to the frame 105 of the stage system 111 or may be mounted to an actuatable base (discussed previously herein).

In another aspect, the magnet 602 may include a permanent magnet 605 having a select pole orientation. In addition, the magnet 602 may include time coils 606.

In another aspect, the magnetically augmented spring mechanism 110 may include a spring sensor 610 configured to sense various kinematic characteristics of the spring mechanism 110, such as acceleration, position, and velocity. Further, the magnetically augmented spring mechanism 110 may include a smart actuator 608. The actuator 608 may include a magneto-rheological damper or a linear electromagnetic motor 609.

Figure 6C:
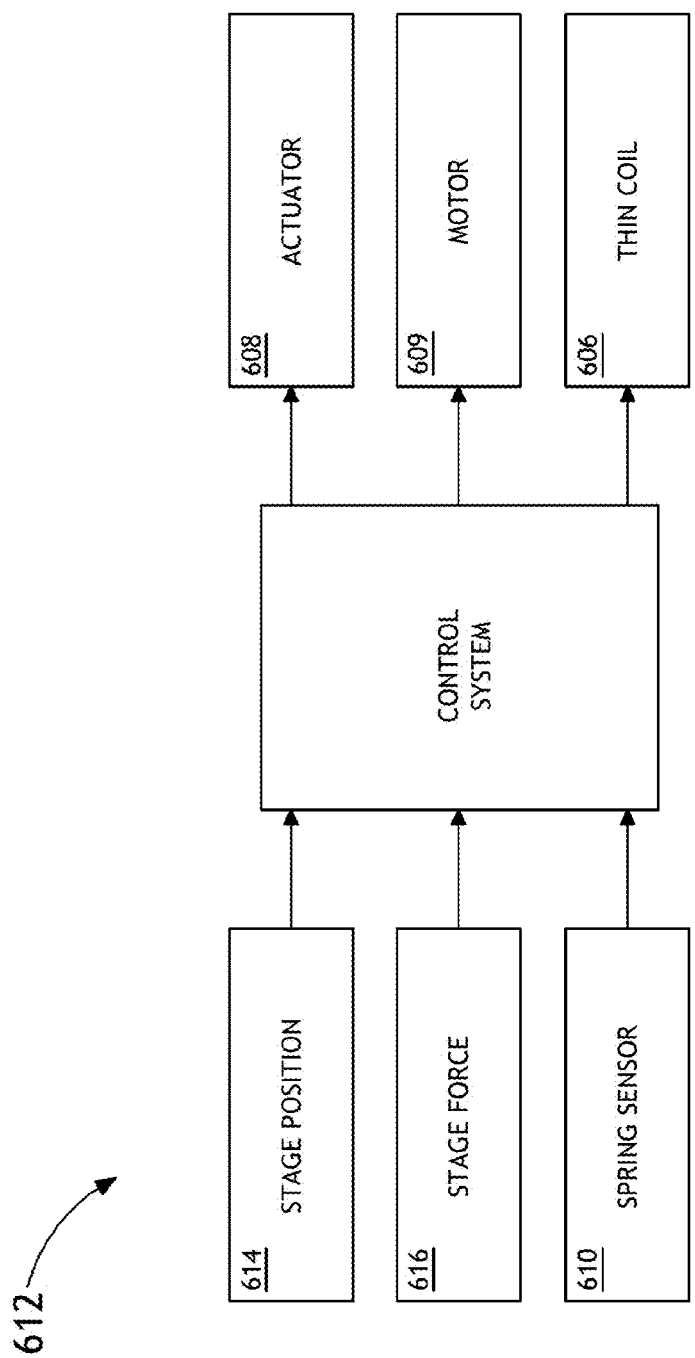
FIG. 6C is a block diagram view of a control system suitable for controlling actuation of the wafer stage system, in accordance with an alternative embodiment of the present invention.

As shown in FIG. 6C, a control system 612 may be used to control the actuation of the wafer stage system 10. In this regard, the control system 612 (e.g., computer control system) may receive stage position information 614, stage force information 616, and spring sensor information from the spring sensor 610. Based on these inputs the control system 612 may then determine appropriate adjustments required of the X-stage motion 101 (requirements discussed in detail previously herein) and transmit command signals to the actuator 608, the linear motor 609 and/or the trim coils 606.

In one embodiment, the control system 612 may cause the spring stiffness, k(x), to become non-linear, allowing the control system 612 to implement an appropriate force profile. In another embodiment, the control system 612 may use the smart actuator 608 to actively control the resonant modes of the spring 603 via the feedback from the spring sensor 610. It is also noted that the stage position may also be used in this type of feedback process. In another embodiment, the control system 612 may use the trim coils 606 to ensure that the off-axis forces on the stage are minimized. X-stage position and the measured maglev forces of the X-stage may be used to determine the appropriate feedback in this scenario.

Figure 7:
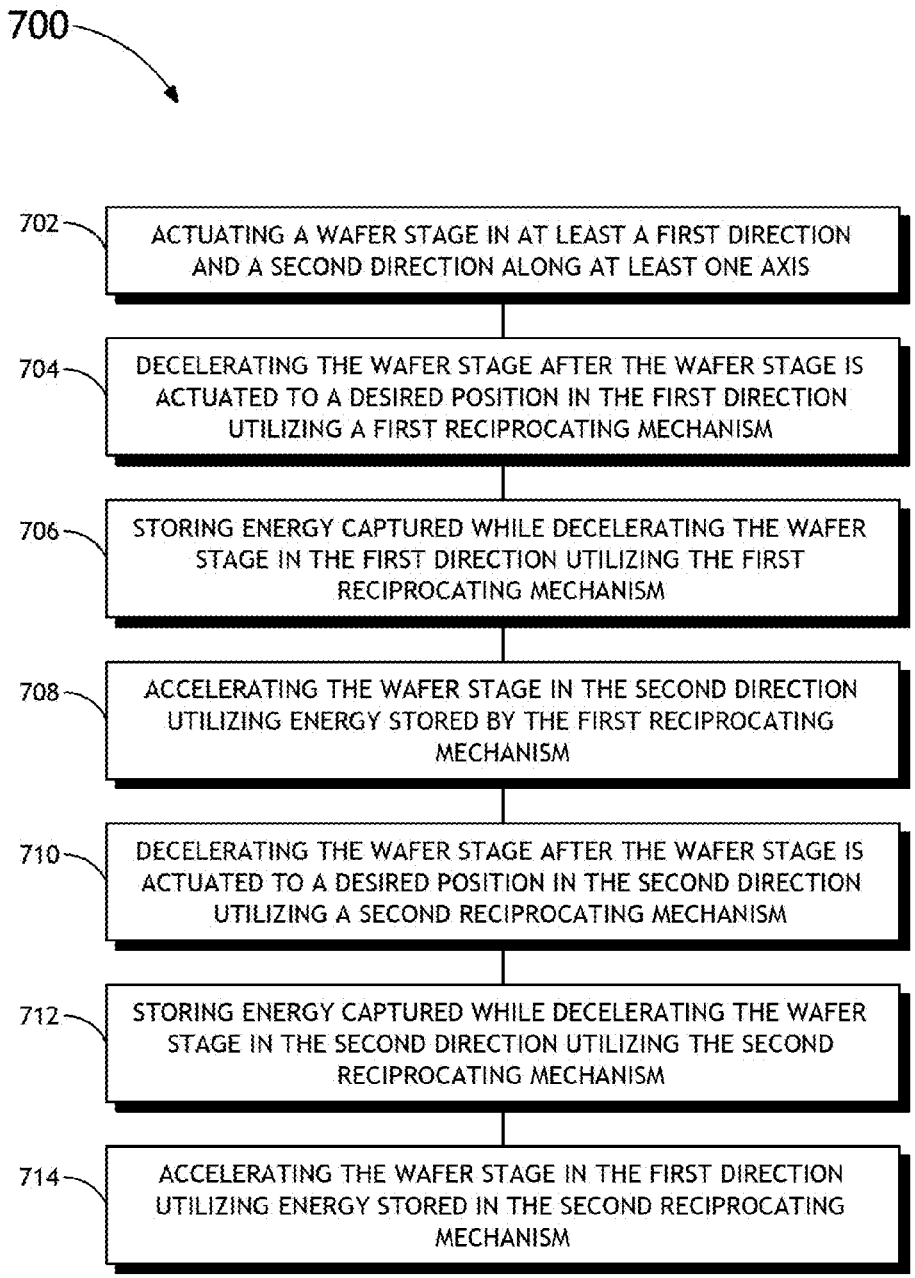
FIG. 7 is a process flow diagram of a method for providing reciprocating actuation control of a scanning wafer stage, in accordance with an alternative embodiment of the present invention.

FIG. 7 illustrates a process flow 700 of a method for providing reciprocating actuation control of a scanning wafer stage.

In step 702, a wafer stage is actuated in at least one of a first direction and a second direction along at least one axis utilizing one or more motors, the wafer stage being configured for receiving a wafer. In step 704, the wafer stage is decelerated after the wafer stage is actuated to a desired position in the first direction utilizing a first reciprocating mechanism. In step 706, captured energy is stored while decelerating the wafer stage in the first direction utilizing the first reciprocating mechanism. In step 708, the wafer stage is accelerated in the second direction utilizing energy stored by the first reciprocating mechanism. In step 710, the wafer stage is decelerated after the wafer stage is actuated to a desired position in the second direction utilizing a second reciprocating mechanism. In step 712, captured energy is stored while decelerating the wafer stage in the second direction utilizing the second reciprocating mechanism. In step 714, the wafer stage is accelerated in the first direction utilizing energy stored in the second reciprocating mechanism.

The process flow 700 may further include the steps of: (i) measuring an amount of velocity loss caused by an interaction between the wafer stage and the first or second reciprocating mechanism; (ii) determining an amount of force required to compensate for the measured velocity loss; and (iii) calibrating the one or more motors utilizing the determined amount of force required to compensate for the measured velocity loss.

Further, the process flow 700 may further include the additional steps of: (i) measuring force dispersion caused by an interaction between the wafer stage and the first or second reciprocating mechanism; (ii) determining a position offset between the first or second reciprocating mechanism and the center of gravity of the wafer stage; and (iii) actuating the first or second reciprocating mechanism to a position aligned with a scanning path of the wafer stage utilizing the determined position offset between the first or second reciprocating mechanism and the center of gravity of the wafer stage.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A wafer stage system with reciprocating wafer stage actuation control, comprising:
    a wafer stage configured for receiving a wafer;
    one or more motors configured to actuate the wafer stage in at least one of a first direction or a second direction along at least one axis;
    a first non-contact magnetic reciprocating mechanism configured to decelerate the wafer stage after the wafer stage is actuated to a desired position in the first direction, the first reciprocating mechanism further configured to store energy captured while decelerating the wafer stage in the first direction, the first reciprocating mechanism further configured to accelerate the wafer stage in the second direction utilizing the energy stored in the first reciprocating mechanism; and
    a second non-contact magnetic reciprocating mechanism configured to decelerate the wafer stage after the wafer stage is actuated to a desired position in the second direction, the second reciprocating mechanism further configured to store energy captured while decelerating the wafer stage in the second direction, the second reciprocating mechanism further configured to accelerate the wafer stage in the first direction utilizing the energy stored in the second reciprocating mechanism, wherein at least one of the first non-contact magnetic reciprocating mechanism or the second non-contact magnetic reciprocating mechanism are disposed at opposite ends of a scanning path along the at least one axis and include one or more spring mechanisms.

2. The system of claim 1, wherein the first non-contact magnetic reciprocating mechanism and the second non-contact magnetic reciprocating mechanism include:
    a pair of spring mechanisms disposed at opposite ends of the scanning path along the at least one axis.

3. The system of claim 2, wherein at least one of the first non-contact magnetic reciprocating mechanism or the second non-contact magnetic reciprocating mechanism includes a spring sensor, the spring sensor being positioned to sense one or more kinematic characteristics of the spring mechanisms.

4. The system of claim 2, wherein at least one of the first non-contact magnetic reciprocating mechanism or the second non-contact magnetic reciprocating mechanism includes a smart actuator, the smart actuator being positioned to control one or more resonant modes of at least one of the first non-contact magnetic reciprocating mechanism or the second non-contact magnetic reciprocating mechanism.

5. The system of claim 4, wherein the smart actuator includes at least one of a magneto-rheological damper or a linear electromagnetic motor.

6. The system of claim 1, wherein the first non-contact magnetic reciprocating mechanism and the second non-contact magnetic reciprocating mechanism include:
a pair of actuatable bases disposed at opposite ends of the scanning path along the at least one axis, the pair of actuatable bases being mechanically coupled to a pair of spring mechanisms, the pair of actuatable bases being configured to actuate the pair of spring mechanisms of the first non-contact magnetic reciprocating mechanism and the second non-contact magnetic reciprocating mechanism to one or more positions for engaging the wafer stage for at least one of deceleration or acceleration.

7. The system of claim 1, wherein the first non-contact magnetic reciprocating mechanism and the second non-contact magnetic reciprocating mechanism include:
a pair of spring mechanisms disposed at opposite ends of the wafer stage aligned with the scanning path along the at least one axis.

8. The system of claim 7, wherein the first non-contact magnetic reciprocating mechanism and the second non-contact magnetic reciprocating mechanism further include:
actuatable bases disposed at opposite ends of the scanning path along the at least one axis, the actuatable bases being configured to actuate to one or more desired positions for engaging the pair of spring mechanisms disposed at opposite ends of the wafer stage for at least one of deceleration or acceleration.

9. The system of claim 1, wherein at least one of the first non-contact magnetic reciprocating mechanism or the second non-contact magnetic reciprocating mechanism include:
at least one electromagnetic actuator.

10. The system of claim 1, wherein at least one of the first non-contact magnetic reciprocating mechanism or the second non-contact magnetic reciprocating mechanism include:
at least one compression spring.

11. The system of claim 1, wherein at least one of the first non-contact magnetic reciprocating mechanism or the second non-contact magnetic reciprocating mechanism include:
at least one extension spring.

12. The system of claim 1, wherein at least one of the first non-contact magnetic reciprocating mechanism or the second non-contact magnetic reciprocating mechanism include:
at least one damper.

13. The system of claim 1, wherein at least one of the first non-contact magnetic reciprocating mechanism or the second non-contact magnetic reciprocating mechanism and the wafer stage include:
at least one pair of magnets disposed parallel to one another, the at least one pair of magnets having like poles facing each other to allow for at least one of acceleration or deceleration of the wafer stage without mechanical contact.

14. The system of claim 1, wherein at least one of the first non-contact magnetic reciprocating mechanism or the second non-contact magnetic reciprocating mechanism includes at least one stator.

15. The system of claim 14, wherein the at least one stator includes one or more stator coils.

16. The system of claim 15, further comprising:
a controller configured to control the one or more stator coils to establish a selected scanning velocity of the wafer stage.

17. The system of claim 16, wherein the controller is configured to deactivate the one or more stator coils upon achieving the selected scanning velocity of the wafer stage.

18. A wafer stage with reciprocating wafer stage actuation control, comprising:
a wafer stage configured for receiving a wafer;
one or more motors configured to actuate the wafer stage in at least one of a first direction or a second direction along at least one axis;
a first non-contact magnetic reciprocating mechanism configured to decelerate the wafer stage after the wafer stage is actuated to a desired position in the first direction, the first non-contact magnetic reciprocating mechanism further configured to store energy captured while decelerating the wafer stage in the first direction, the first non-contact magnetic reciprocating mechanism further configured to accelerate the wafer stage in the second direction utilizing the energy stored in the first non-contact magnetic reciprocating mechanism; and
a second non-contact magnetic reciprocating mechanism configured to decelerate the wafer stage after the wafer stage is actuated to a desired position in the second direction, the second non-contact magnetic reciprocating mechanism further configured to store energy captured while decelerating the wafer stage in the second direction, the second non-contact magnetic reciprocating mechanism further configured to accelerate the wafer stage in the first direction utilizing the energy stored in the second non-contact magnetic reciprocating mechanism, wherein the first non-contact magnetic reciprocating mechanism and the second non-contact magnetic reciprocating mechanism are disposed at opposite ends of a scanning path along the at least one axis; and
a computing system communicatively coupled to the one or more motors and one or more motion detectors, the computing system being configured to:
measure a velocity loss caused by an interaction between the wafer stage and at least one of the first non-contact magnetic reciprocating mechanism or the second non-contact magnetic reciprocating mechanism;
determine a force profile required to compensate for the measured velocity loss; and
calibrate the one or more motors utilizing the determined force profile required to compensate for the measured velocity loss.

19. The system of claim 18, wherein the computing system is further configured to:
measure at least one additional velocity loss caused by at least one additional interaction between the wafer stage and at least one of the first non-contact magnetic reciprocating mechanism or the second non-contact magnetic reciprocating mechanism;

determine at least one additional force profile required to compensate for the at least one additional measured velocity loss; and calibrate the one or more motors utilizing the at least one additional determined force profile required to compensate for the at least one additional measured velocity loss.

20. The system of claim 9, wherein the computing system is further configured to calibrate the one or more motors at a plurality of scanning velocities.

21. The system of claim 18, wherein the computing system is further configured to:

measure force dispersion caused by an interaction between the wafer stage and at least one of the first non-contact magnetic reciprocating mechanism or the second non-contact magnetic reciprocating mechanism;

determine a position offset between at least one of the first non-contact magnetic reciprocating mechanism or the second non-contact magnetic reciprocating mechanism and the center of gravity of the wafer stage; and actuate at least one of the first non-contact magnetic reciprocating mechanism or the second non-contact magnetic reciprocating mechanism to a position aligned with the scanning path of the wafer stage utilizing the determined position offset between the first non-contact magnetic reciprocating mechanism or the second non-contact magnetic reciprocating mechanism and the center of gravity of the wafer stage.

22. A method for providing reciprocating actuation control of a scanning wafer stage, comprising:

actuating a wafer stage in at least one of a first direction or a second direction along at least one axis utilizing one or more motors, the wafer stage being configured for receiving a wafer;

decelerating the wafer stage after the wafer stage is actuated to a desired position in the first direction utilizing a first non-contact magnetic reciprocating mechanism;

storing energy captured while decelerating the wafer stage in the first direction utilizing the first non-contact magnetic reciprocating mechanism;

accelerating the wafer stage in the second direction utilizing energy stored by the first non-contact magnetic reciprocating mechanism;

decelerating the wafer stage after the wafer stage is actuated to a desired position in the second direction utilizing a second non-contact magnetic reciprocating mechanism, wherein the first non-contact magnetic reciprocating mechanism and the second non-contact magnetic reciprocating mechanism are disposed at opposite ends of a scanning path along the at least one axis;

storing energy captured while decelerating the wafer stage in the second direction utilizing the second non-contact magnetic reciprocating mechanism; and accelerating the wafer stage in the first direction utilizing energy stored in the second non-contact magnetic reciprocating mechanism, wherein at least one of the first non-contact magnetic reciprocating mechanism or the second non-contact magnetic reciprocating mechanism are disposed at opposite ends of a scanning path along the at least one axis and include one or more spring mechanisms.

23. The method of claim 22, further comprising:

measuring an amount of velocity loss caused by an interaction between the wafer stage and at least one of the first non-contact magnetic reciprocating mechanism or the second non-contact magnetic reciprocating mechanism;

determining an amount of force required to compensate for the measured velocity loss; and calibrating the one or more motors utilizing the determined amount of force required to compensate for the measured velocity loss.

24. The method of claim 23, further comprising:

measuring at least one additional amount of velocity loss caused by at least one additional interaction between the wafer stage and at least one of the first non-contact magnetic reciprocating mechanism or the second non-contact magnetic reciprocating mechanism;

determine at least one additional amount of force required to compensate for the at least one additional measured velocity loss; and calibrating the one or more motors utilizing the at least one additional determined amount of force required to compensate for the at least one additional measured velocity loss.

25. The method of claim 24, further comprising:

calibrating the one or more motors at a plurality of scanning velocities.

26. The method of claim 23, further comprising:

measuring force dispersion caused by an interaction between the wafer stage and at least one of the first non-contact magnetic reciprocating mechanism or the second non-contact magnetic reciprocating mechanism;

determining a position offset between at least one of the first non-contact magnetic reciprocating mechanism or the second non-contact magnetic reciprocating mechanism and the center of gravity of the wafer stage; and actuating at least one of the first non-contact magnetic reciprocating mechanism or the second non-contact magnetic reciprocating mechanism to a position aligned with a scanning path of the wafer stage utilizing the determined position offset between the first non-contact magnetic reciprocating mechanism or the second non-contact magnetic reciprocating mechanism and the center of gravity of the wafer stage.

\* \* \* \* \*